(12) United States Patent
Kim et al.

(10) Patent No.: US 10,134,820 B2
(45) Date of Patent: Nov. 20, 2018

(54) ORGANIC LIGHT-EMITTING DISPLAY DEVICE HAVING A REPAIR AREA

(71) Applicant: LG Display Co., Ltd., Seoul (KR)

(72) Inventors: Young-Mi Kim, Paju-si (KR); Woo-Sup Shin, Paju-si (KR); Sie-Hyug Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/799,843

(22) Filed: Oct. 31, 2017

(65) Prior Publication Data

US 2018/0122878 A1 May 3, 2018

(30) Foreign Application Priority Data

Oct. 31, 2016 (KR) ........................ 10-2016-0143862

(51) Int. Cl.
*H01L 27/32* (2006.01)
*H01L 51/52* (2006.01)
*H01L 51/56* (2006.01)

(52) U.S. Cl.
CPC ...... *H01L 27/3248* (2013.01); *H01L 27/3209* (2013.01); *H01L 27/3218* (2013.01); *H01L 27/3262* (2013.01); *H01L 51/5256* (2013.01); *H01L 51/56* (2013.01); *H01L 51/5225* (2013.01); *H01L 51/5234* (2013.01); *H01L 51/5262* (2013.01); *H01L 2251/5392* (2013.01); *H01L 2251/558* (2013.01); *H01L 2251/568* (2013.01)

(58) Field of Classification Search
CPC ....... H01L 2251/558; H01L 2251/5392; H01L 51/5262; H01L 51/5234; H01L 2251/568; H01L 51/5225

See application file for complete search history.

(56) References Cited

U.S. PATENT DOCUMENTS

| | | | |
|---|---|---|---|
| 8,969,874 B2* | 3/2015 | Yun | H01L 51/5209 257/59 |
| 9,159,949 B2* | 10/2015 | You | H01L 51/5225 |
| 9,343,693 B2* | 5/2016 | Lee | H01L 27/3244 |
| 2004/0096993 A1 | 5/2004 | Kuo | |
| 2009/0162949 A1 | 6/2009 | Takagi et al. | |
| 2011/0018434 A1 | 1/2011 | Miyaguchi | |
| 2012/0146030 A1* | 6/2012 | You | H01L 27/124 257/59 |
| 2015/0008398 A1* | 1/2015 | Lee | H01L 51/5212 257/40 |

(Continued)

FOREIGN PATENT DOCUMENTS

| | | |
|---|---|---|
| JP | 2003-282249 A | 10/2003 |
| WO | 2016/084408 A1 | 6/2016 |

*Primary Examiner* — Tracie Y Green
(74) *Attorney, Agent, or Firm* — Seed IP Law Group LLP

(57) ABSTRACT

Provided is an organic light-emitting display device which enables a fast and secure repair process without changing optical characteristics. The organic light-emitting display device includes a lower electrode, an organic emitting layer, an upper electrode and an optical compensation layer which are sequentially stacked. The upper electrode is thinner than the lower electrode. An opening is formed by particles in the organic emitting layer and the upper electrode. The opening caused by the particles is extended between the lower electrode and the organic emitting layer.

20 Claims, 10 Drawing Sheets

(56) References Cited

U.S. PATENT DOCUMENTS

| | | | |
|---|---|---|---|
| 2015/0129857 A1* | 5/2015 | Lee | H01L 51/5268 257/40 |
| 2016/0005992 A1 | 1/2016 | Song et al. | |
| 2017/0222149 A1 | 8/2017 | Nakadaira et al. | |

* cited by examiner

ORGANIC LIGHT-EMITTING DISPLAY DEVICE HAVING A REPAIR AREA

CROSS-REFERENCE TO RELATED APPLICATION(S)

This application claims the benefit of Korean Patent Application No. 10-2016-0143862, filed on Oct. 31, 2016, which is hereby incorporated by reference as if fully set forth herein.

BACKGROUND

Technical Field

The present disclosure relates to an organic light-emitting display device including a repair area in which an upper electrode connected to a lower electrode due to particles has been removed.

Description of the Related Art

In general, electronic apparatuses such as monitors, TVs, notebook computers and digital cameras include display devices for displaying images. For example, display devices can include a liquid crystal display device (LCD) and an organic light-emitting display device.

The organic light-emitting display device may include a light-emitting structure that emits a specific color. For example, the light-emitting structure of the organic light-emitting display device may include a lower electrode, an organic emitting layer and an upper electrode which are sequentially stacked.

The organic light-emitting display device may include a plurality of light-emitting regions. Light-emitting structures which are independently driven may be positioned in the light-emitting regions. For example, in the organic light-emitting display device, the lower electrode of each light-emitting structure may be insulated from the lower electrode of a neighboring light-emitting structure. The organic light-emitting display device may further include a bank insulating layer which fills a space between the lower electrodes of neighboring light-emitting structures.

A method of manufacturing the organic light-emitting display device may include a repair process in order to remove a portion of an upper electrode which is connected to a lower electrode due to particles generated during a manufacturing process. For example, the repair process may include an R-aging process using Joule heating.

However, the repair process of the organic light-emitting display device requires a long time due to the thick upper electrode. Furthermore, the repair process of the organic light-emitting display device has difficulty in predicting a process termination time because the area of the upper electrode which contacts the lower electrode depends on the form of particles. Also, since the thickness of the upper electrode is related to optical characteristics of emitted light, it is difficult to reduce a set thickness of the upper electrode to solve problems of the repair process.

BRIEF SUMMARY

One object of the present disclosure is to provide an organic light-emitting display for reducing a time required for a repair process without changing its optical characteristics.

Another object of the present disclosure is to provide an organic light-emitting display device for easily removing a portion of the upper electrode which is inadvertently connected to the lower electrode.

The technical problems solved and advantages provided by the present disclosure are not limited to just the above technical problems and those skilled in the art will understand other advantages and benefits from the following description.

To accomplish the object of the present disclosure, an organic light-emitting display device according to the embodiment of one present disclosure includes a lower electrode on a lower substrate. An organic emitting layer is on the lower electrode that includes a first penetrating hole. An upper electrode on the organic emitting layer includes a second penetrating hole aligned with the first penetrating hole. An optical compensation layer is on the upper electrode covering the second penetrating hole. The sidewall of the first penetrating hole includes a lower sidewall and an upper sidewall disposed on the lower sidewall. In one embodiment, the lower sidewall of the first penetrating hole is negatively tapered, while the upper sidewall of the first penetrating hole is positively tapered.

A minimum width of the second penetrating hole may be less than a minimum width of the first penetrating hole.

The sidewall of the second penetrating hole may be disposed on the upper sidewall of the first penetrating hole.

The vertical length of the lower sidewall of the first penetrating hole may be less than the vertical length of the upper sidewall of the first penetrating hole.

The optical compensation layer may be extended to the inside of the first penetrating hole and the second penetrating hole.

The optical compensation layer may directly contact the lower electrode in the first penetrating hole.

The optical compensation layer may directly contact the lower sidewall of the first penetrating hole.

The thickness of the upper electrode may be smaller than that of the lower electrode.

The organic light-emitting display device may further include an element passivation layer on the optical compensation layer. The optical compensation layer may have a refractive index between the refractive index of the upper electrode and the refractive index of the element passivation layer.

The resistance of the optical compensation layer may be greater than that of the upper electrode.

The optical compensation layer may include metal oxide.

The optical compensation layer may include a hydrogen storage metal.

To accomplish the other object of the present disclosure, an organic light-emitting display device includes: a lower substrate including a normal area and a repair area; a light-emitting structure on the lower substrate and including a lower electrode, an organic emitting layer and an upper electrode, which are sequentially stacked; an optical compensation layer on the upper electrode of the light-emitting structure; and a penetrating hole on the repair area of the lower substrate and penetrating the organic emitting layer and the upper electrode of the light-emitting structure. The upper electrode thinner that the lower electrode. An end portion of the organic emitting layer facing the penetrating hole includes an undercut. The end portion of the organic emitting layer facing the penetrating hole may be disposed closer to the penetrating hole than an end portion of the upper electrode facing the penetrating hole.

The organic light-emitting display device may further include air gap between the lower electrode and the optical compensation layer on the repair area of the lower substrate.

The air gap may be connected to the undercut of the organic emitting layer.

An organic light-emitting display devices according one embodiment of the present disclosure provides that a portion of the upper electrode which is connected to the lower electrode due to particles can be easily removed. Accordingly, a time required for the repair process can be reduced and the portion of the upper electrode connected to the lower electrode due to particles does not remain after the repair process in the organic light-emitting display devices according to the technical spirit of the present disclosure. Therefore, it is possible to improve production efficiency and reliability of the organic light-emitting display devices according to the technical spirit of the present disclosure.

DETAILED DESCRIPTION

Figure 1:
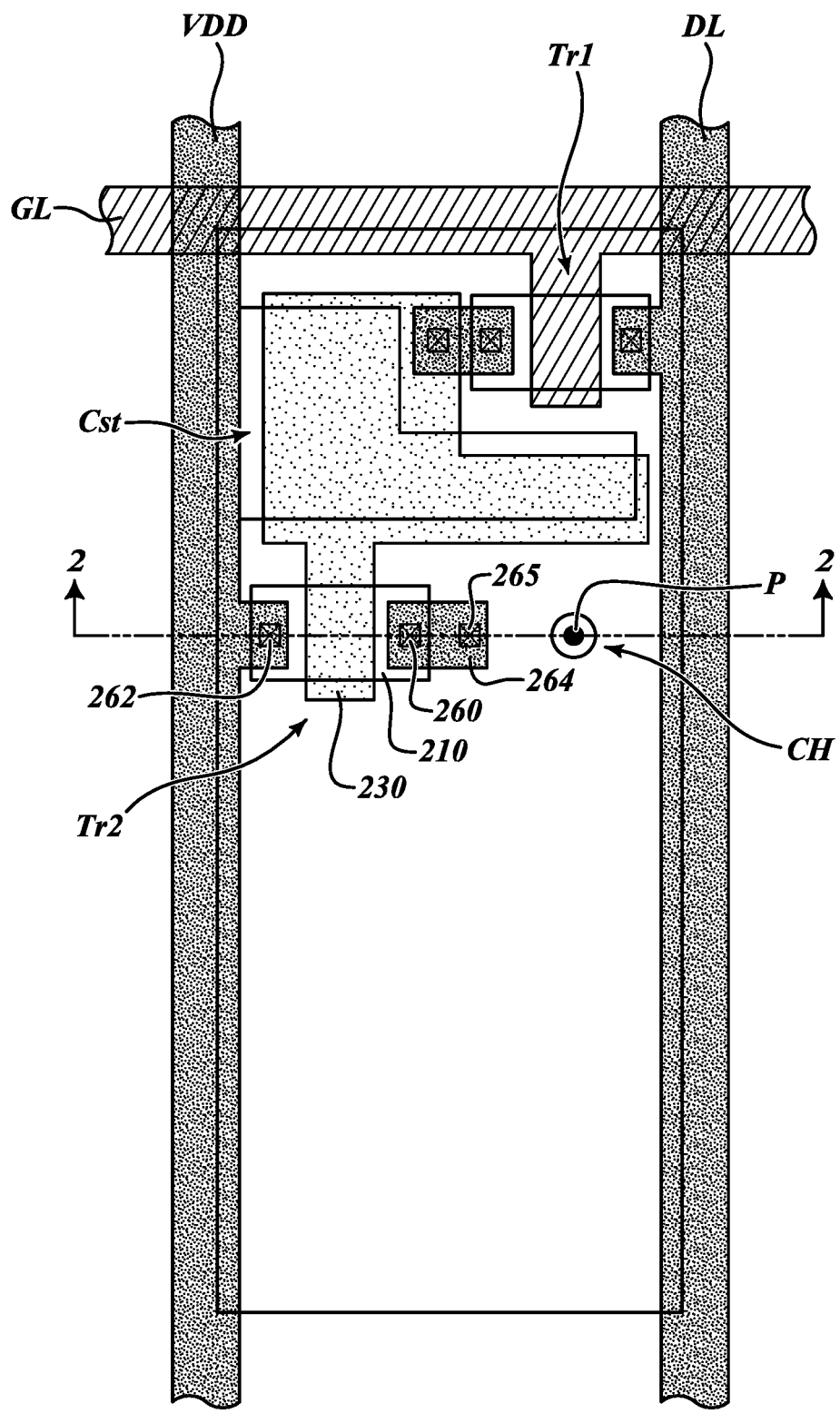
FIG. 1 is a plan view showing an organic light-emitting display device according to an embodiment of the present disclosure.

Hereinafter, details related to the above benefits, technical configurations, and operational effects of the present disclosure will be clearly understood by the following detailed description with reference to the drawings, which illustrate embodiments of the present disclosure. Here, the embodiments of the present disclosure are provided in order to allow the technical sprit of the present disclosure to be sufficiently conveyed to those skilled in the art, and thus the present disclosure may be embodied in other forms and is not limited to the embodiments described below.

In addition, the same or extremely similar elements are designated by the same reference numerals throughout the specification, and in the drawings, the lengths and thickness of layers and regions may be enlarged to better illustrate the feature. It will be understood that, when a first element is referred to as being "on" a second element, although the first element may be disposed on the second element so as to come into contact with the second element, a third element may be interposed between the first element and the second element. The terms "directly on" or "directly contact" have the meaning that the first element is in physical contact with the second element with nothing interposed between. The term "overlying" is used in its broadest sense, meaning that one element is above a second element and positioned over it, and it may or may not be in contact with it. The term "above" means an element is higher than another in the direction indicated, and it may or may not be overlying it or on it.

Terms such as, for example, "first" and "second" may be used to distinguish any one element from another element. However, the first element and the second element may be arbitrarily named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments pertains. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
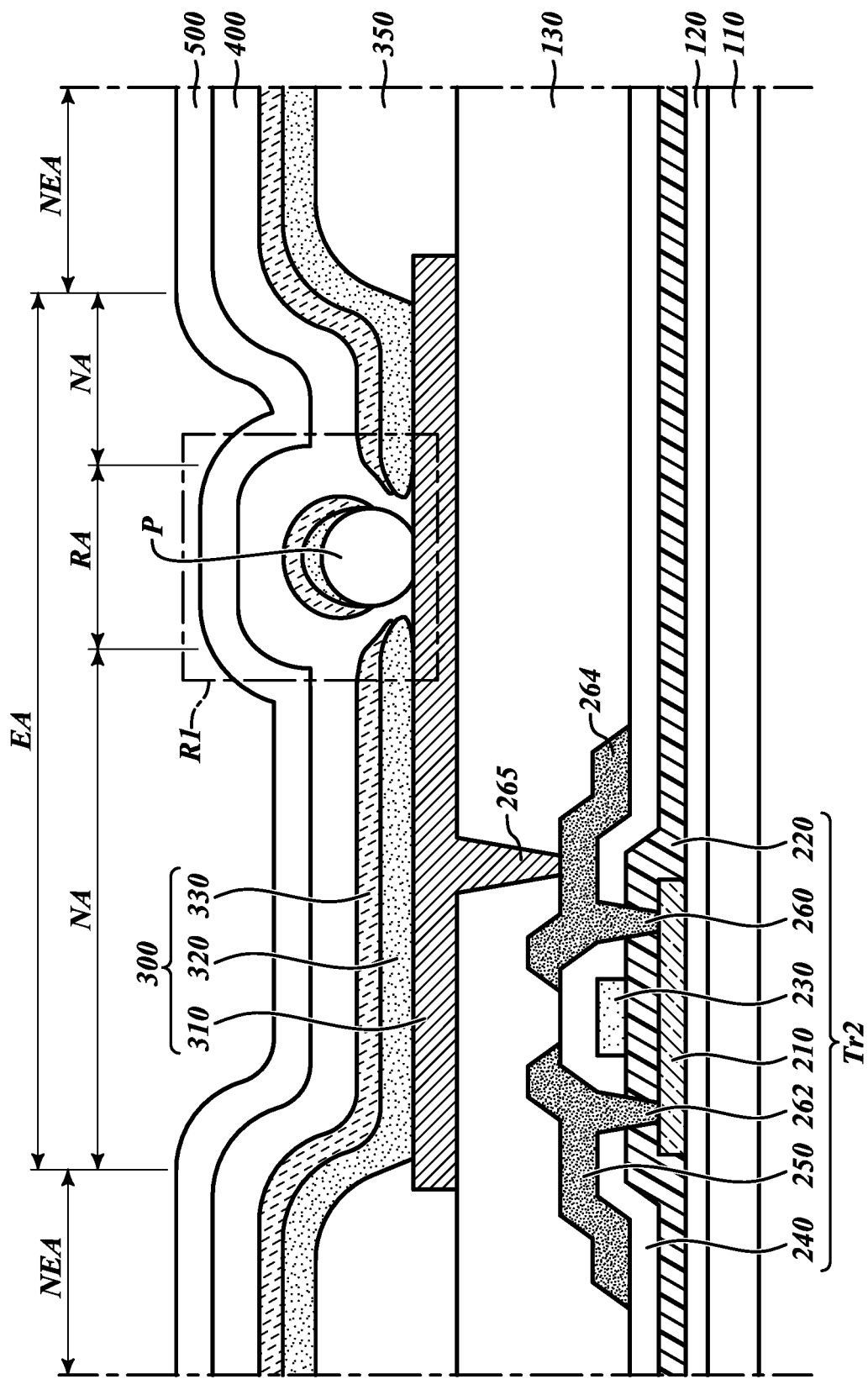
FIG. 2 is a cross-sectional view taken along line 2-2 of FIG. 1.
Figure 3:
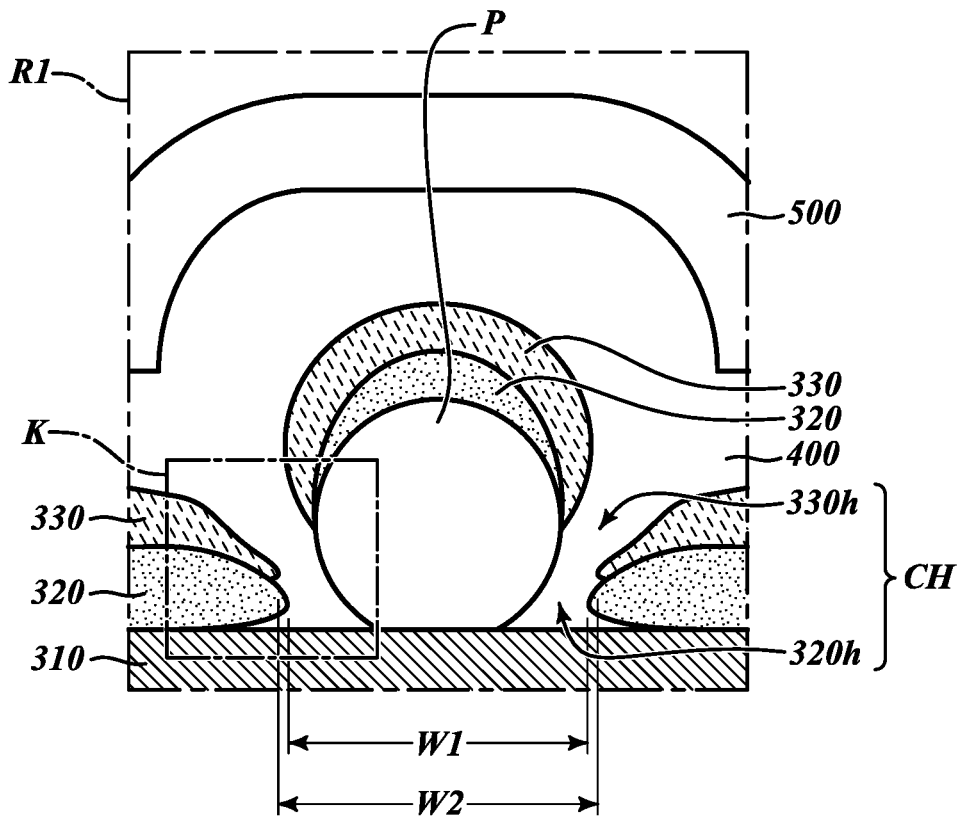
FIG. 3 is an enlarged view of an area R1 of FIG. 2.
Figure 4:
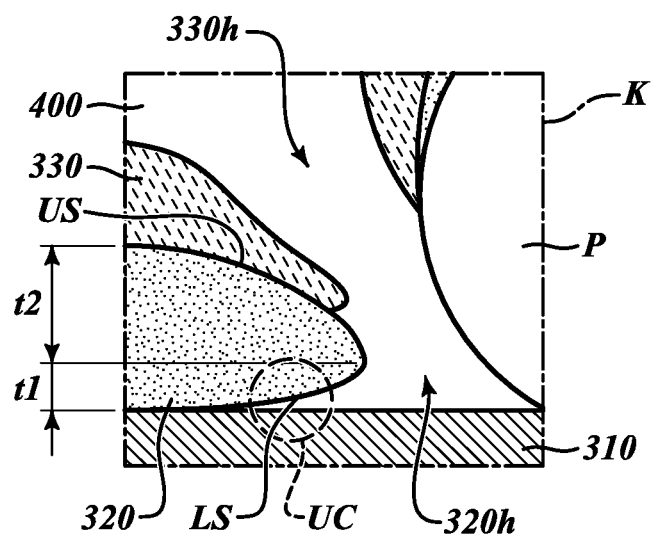
FIG. 4 is an enlarged view of an area K of FIG. 3.

FIG. 1 is a plan view showing an organic light-emitting display device according to an embodiment of the present disclosure. FIG. 2 is a cross-sectional view taken along line 2-2 of FIG. 1. FIG. 3 is an enlarged view of an area R1 of FIG. 2. FIG. 4 is an enlarged view of an area K of FIG. 3.

Referring to FIGS. 1 to 4, an organic light-emitting display device according to an embodiment of the present disclosure may include a lower substrate 110, at least one thin film transistor, either Tr1 or Tr2, or both, a light-emitting structure 300 and an optical compensation layer 400.

The lower substrate 110 can support the thin film transistors Tr1 and Tr2 and the light-emitting structure 300. The lower substrate 110 may include an insulating material. For example, the lower substrate 110 may include glass or plastic.

A gate line GL, a data line DL and a power supply voltage line VDD may be disposed on the lower substrate 110. The data line DL may overlay the gate line GL at some locations and might extend perpendicular to it. The power supply voltage line VDD may be parallel with the gate line GL or the data line DL. For example, the power supply voltage line VDD may also overlay the gate line GL at some locations.

The gate line GL, the data line DL and the power supply voltage line VDD may define pixel or subpixel regions. For example, each pixel region may be within an area defined by the gate line GL, the data line DL and the power supply voltage line VDD. A circuit for controlling the light-emitting structure 300 may be positioned in the each pixel region. For example, a selection thin film transistor Tr1, a driving thin film transistor Tr2 and a storage capacitor Cst may be disposed in the each pixel region.

The selection thin film transistor Tr1 can turn on/off the driving thin film transistor Tr2 according to a gate signal applied through the gate line GL. The driving thin film transistor Tr2 can supply driving current to the corresponding light-emitting structure 300 according to a signal of the selection thin film transistor Tr1. For example, the selection thin film transistor Tr1 may have the same structure as the driving thin film transistor Tr2. The storage capacitor Cst can maintain the signal of the selection thin film transistor Tr1 applied to the driving thin film transistor Tr2 for a predetermined time.

The driving thin film transistor Tr2 may include a semiconductor material 210, a gate insulating layer 220, a gate electrode 230, an interlayer insulating layer 240, a source electrode 250 and a drain electrode 264.

The semiconductor material 210 may be disposed close to the lower substrate 100. For example, the semiconductor material 210 may include amorphous silicon, polysilicon or an oxide semiconductor material such as IGZO.

The semiconductor material 210 may include a source region, a drain region and a channel region. The channel region may be positioned between the source region and the drain region. Conductivity of the channel region may be lower than conductivities of the source region and the drain region. For example, the source region and the drain region may contain conductive impurities. As can be seen in FIGS. 1 and 2, a contact 262 extends from the VDD line to a source electrode 250 of the semiconductor material 210 and a contact 260 extends from a drain electrode 264 to the semiconductor material 210.

The organic light-emitting display device according to the embodiment of the present disclosure may further include a buffer layer 120 disposed between the lower substrate 110 and the semiconductor material 210. The buffer layer 120 may be extended beyond the thin film transistors Tr1 and Tr2. For example, the buffer layer 120 may completely cover the surface of the lower substrate 110. The buffer layer 120 may include an insulating material. For example, the buffer layer 120 may include silicon oxide.

The gate insulating layer 220 may be disposed on the semiconductor material 210. The gate insulating layer 220 may be extended beyond the semiconductor material 210. For example, the gate insulating layer 220 may be in direct contact with the buffer layer 120 outside the semiconductor material 210. The gate insulating layer 220 may include an insulating material. For example, the gate insulating layer 220 may include silicon oxide and/or silicon nitride. The gate insulating layer 220 may also include a high-K material. For example, the gate insulating layer 220 may include hafnium oxide (HfO) or titanium oxide (TiO). The gate insulating layer 220 may be a multi-layer structure of several different types of insulators, as is known in the art.

The gate electrode 230 may be disposed on the gate insulating layer 220. The gate electrode 230 may overlap with the channel region of the semiconductor material 210. The gate electrode 230 may include a conductive material. For example, the gate electrode 230 may include a metal such as aluminum (Al), chrome (Cr), molybdenum (Mo) or tungsten (W).

The interlayer insulating layer 240 may be disposed on the gate insulating layer 220 and the gate electrode 230. The interlayer insulating layer 240 may be extended beyond the semiconductor material 210. For example, the interlayer insulating layer 240 may directly contact the gate insulating layer 220 outside the semiconductor material 210. The interlayer insulating layer 240 may include an insulating material. For example, the interlayer insulating layer 240 may include silicon oxide and/or silicon nitride. The interlayer insulating layer 240 may be a multi-layer structure.

The source electrode 250 and the drain electrode 260 may be disposed on the interlayer insulating layer 240. The drain electrode 260 may be spaced from the source electrode 250. The source electrode 250 may be electrically connected to the source region of the semiconductor material 210. The drain electrode 260 may be electrically connected to the drain region of the semiconductor material 210. For example, the gate insulating layer 220 and the interlayer insulating layer 240 may include a contact hole exposing the source region of the semiconductor material 210 and a contact hole exposing the drain region of the semiconductor material 210.

Each of the source electrode 250 and the drain electrode 260 may include conductive material. For example, each of the source electrode 250 and the drain electrode 260 may include metal such as aluminum (Al), chrome (Cr), molybdenum (Mo) and tungsten (W). The drain electrode 260 may include the same material as the source electrode 250. For example, the drain electrode 260 and the source electrode 250 may be formed through the same etching process. The gate electrode 230 may include a material different from the drain electrode 260.

The organic light-emitting display device according to the embodiment of the present disclosure is described that the thin film transistors Tr1 and Tr2 include the semiconductor material 210 disposed close to the lower substrate 110. However, in an organic light-emitting display device according to another embodiment of the present disclosure, the semiconductor material 210 of the thin film transistors Tr1 and Tr2 may be disposed between the gate electrode 230 and the source and drain electrodes 250 and 260.

The organic light-emitting display device according to the embodiment of the present disclosure may further include an over-coat layer 130 on the thin film transistors Tr1 and Tr2. The over-coat layer 130 may remove a thickness difference caused by the thin film transistors Tr1 and Tr2. The over-coat layer 130 may include an insulating material. For example, the overcoat layer 130 may include silicon oxide.

The organic light-emitting display device according to the embodiment of the present disclosure is described that thin film transistors Tr1 and Tr2 is in direct contact with the over-coat layer 130. However, an organic light-emitting display device according to another embodiment of the present disclosure may further include a lower passivation layer between the thin film transistors Tr1 and Tr2 and the over-coat layer 130. The lower passivation layer may include an insulating material. The lower passivation layer may include a material different from the over-coat layer 130. For example, the lower passivation layer may include silicon nitride.

The light-emitting structure 300 may output a specific color. For example, the light-emitting structure 300 may include a lower electrode 310, an organic emitting layer 320 and an upper electrode 330 which are sequentially stacked.

The light-emitting structure 300 may be controlled by the thin film transistors Tr1 and Tr2 positioned in the corresponding pixel region. For example, the lower electrode 310 of the light-emitting structure 300 may be electrically connected to the drain electrode 264 of the corresponding driving thin film transistor Tr2. The light-emitting structure 300 may be disposed on the over-coat layer 130. For example, the over-coat layer 130 may include a contact hole exposing the drain electrode 260 of the driving thin film transistor Tr2 for connection by contact 265.

The lower electrode 310 may include a conductive material. The lower electrode 310 may include a material having high reflectivity. For example, the lower electrode 310 may include a metal such as aluminum (Al), silver (Ag), or other material that is highly conductive, namely, has a very low resistivity. The lower electrode 310 may be a multi-layer structure. For example, the lower electrode 310 may have a structure in which a reflection electrode including a material having high reflectivity is positioned between transparent electrodes including a transparent conductive material such as ITO or IZO.

The organic emitting layer 320 can generate light having luminance corresponding to a voltage difference between the lower electrode 310 and the upper electrode 330. For example, the organic emitting layer 320 may include an emitting material layer (EML) including an emitting material. The emitting material may be an organic material. The organic emitting layer 320 may be a multi-layer structure in order to improve emission efficiency. For example, the organic emitting layer 320 may include at least one of a hole injection layer (HIL), a hole transport layer (HTL), an electron transport layer (ETL) and an electron injection layer (EIL).

The upper electrode 330 may include a conductive material. The upper electrode 330 may include a material different from the lower electrode 310. For example, the upper electrode 330 may include a transparent material. Thus, in the organic light-emitting display device according to the embodiment of the present disclosure, light generated from the organic emitting layer 320 can be emitted through the upper electrode 330. The upper electrode 330 may be thinner than the lower electrode 310, for example, two to three times thinner in some embodiments. It can be made of ITO, IZO, or other transparent, conductive material.

In some embodiments, a repairing process can be successfully performed in a short time when a ratio of a thickness of the upper electrode 330 to a thickness of the lower electrode 310 is within a selected range. For instance, the ratio can be set to within the range of 2/3 to 1/15 of the thickness of the lower electrode 310. In one preferred embodiment, the ratio of upper electrode 330 is set to be in the range of 1/6 to 1/14 that of the lower electrode 330.

In various embodiments, the ratio is set to be not more than about 2/3, 1/2, 1/3, 1/4, 1/5, 1/6, 1/7, 1/8, 1/9, 1/10, 1/11, 1/12, or 1/13, or even not more than 1/14, or 1/15. More particularly, ratio of a thickness of the upper electrode to a thickness of the lower electrode is set to not more than about 1/6. In other embodiments, a ratio of 1/9, 1/12, or 1/14 is preferred.

The actual thickness of the upper electrode 330 is also of interest because of the process used to repair the fault. A thinner upper electrode 330, as measured in nm is preferred, but this must be balanced against a desire to have lower electrical resistance for the upper electrode 330. In a preferred embodiment, the upper electrode 330 has a physical thickness in the range of 600 nm to 100 nm. In other embodiments, a range of 400 nm to 200 nm is preferred. This provides adequate electrical conductivity for functioning of the circuit and yet permits fixing the defects as set forth herein. If the type of metal used for the upper electrode 330 has a lower resistance, than the electrode can have a lower absolute value of thickness, for example, 150 nm instead of 400 nm. In some embodiments, a thickness of the upper electrode can be less than 100 nm, for example 50 nm. It can be set to not more than about 700 nm, 600 nm, 500 nm, 400 nm, 300 nm, 250 nm, 200 nm, 150 nm, 120 nm, or 100 nm.

An end portion of the organic emitting layer 320 facing the penetrating hole includes an undercut. The end portion of the organic emitting layer 320 facing the penetrating hole may be disposed closer to the penetrating hole than an end portion of the upper electrode facing the penetrating hole.

Improved optical characteristic of the emitted light may be observed by use of the optical compensation layer, and appears dramatic when the upper electrode is thinner than the lower electrode.

The organic light-emitting display device may further include air gap AG between the lower electrode 310 and the optical compensation layer on the repair area of the lower substrate.

The air gap AG may be connected to the undercut of the organic emitting layer 320.

In the organic light-emitting display devices according to the technical spirit of the present invention, a portion of the upper electrode 330 which is connected to the lower electrode 310 due to particles can be easily removed. Accordingly, a time required for the repair process can be reduced and the portion of the upper electrode 330 connected to the lower electrode 310 due to particles does not remain after the repair process in the organic light-emitting display devices according to the technical spirit of the present invention. Therefore, it is possible to improve production efficiency and reliability of the organic light-emitting display devices according to the technical spirit of the present disclosure.

The organic light-emitting display device according to the embodiment of the present disclosure may further include a bank insulating layer 350 for insulating lower electrodes 310 positioned in neighboring pixel regions from each other. For example, the bank insulating layer 350 may cover the edge of the lower electrode 310. The organic emitting layer 320 and the upper electrode 330 may be formed on a portion of the surface of the lower electrode 310, exposed by the bank insulating layer 350. Thus, the lower substrate 110 of the organic light-emitting display device according to the embodiment of the present disclosure may include an emission area labeled EA in which the light-emitting structure 300 including the lower electrode 310, the organic emitting layer 320 and the upper electrode 330 which are sequentially stacked, is positioned, and a non-emission area, labeled NEA overlapping with the bank insulating layer 350. The organic emitting layer 320 and the upper electrode 330 may be extended to the bank insulating layer 350.

In some instances, an impurity, debris or other undesired material may be present as particle P in the light emission area EA. The particle P is an impurity which might be electrically conductive or, alternatively, it might be nonconductive and yet disrupt the pattern of the lower electrode 310, organic emitting layer 320, and the upper electrode 330. The presence of the particle P might cause the lower electrode 310 to be inadvertently connected to the upper electrode 330 which might cause a defect in the pixel and therefore prevent the pixel from being illuminated when it should be turned on by transistors TR1 and TR2. Accordingly, the particle P may be a very small debris which might cause a defect in an entire pixel. Therefore it is desired to repair the area around the defect of the small debris in order to prevent it from inadvertently connecting the lower electrode 310 to the upper electrode 330 that will short out the entire pixel.

The particle P may have any arbitrary shape or size. It is shown here generally cylindrical, however, as can be appreciated, the particle P may be oblong, an ellipsoid, or have a roughened outer surface having various spikes, dimples or other outer contours. It is shown generally spherical for convenience in the figures, and as will be appreciated, the size, shape, texture, location and makeup of particle P will vary in each different instance because it is an impurity that should not be present.

Particles P may be inadvertently positioned on the lower electrode 310. A portion of the surface of the lower electrode 310 around the particles P may not be covered by the organic emitting layer 320 and the upper electrode 330, because it blocked the proper formation process. The emission area EA of the organic light-emitting display device according to the embodiment of the present disclosure may include a normal area NA in which the surface of the lower electrode 310 is covered by the organic emitting layer 320, and a repair area RA in which the surface of the lower electrode 310 is not covered by the organic emitting layer 320. The particles P may be disposed on a portion of the surface of the lower electrode 310 which overlaps with the repair area RA of the lower substrate 110.

The organic light-emitting display device according to the embodiment of the present disclosure may further include a penetrating hole CH on the repair area RA. The penetrating hole CH may penetrate the organic emitting layer 320 and the upper electrode 330. The particles P may be disposed in the penetrating hole CH. The penetrating hole CH may include a first penetrating hole 320h in the organic emitting layer 320 and a second penetrating hole 330h in the upper electrode 330.

The first penetrating hole 320h may include a lower sidewall LS and an upper sidewall US. The lower sidewall LS of the first penetrating hole 320h may be disposed near the lower electrode 310. The upper sidewall US of the first penetrating hole 320h may be disposed on the lower sidewall LS of the first penetrating hole 320h. The upper sidewall US of the first penetrating hole 320h may be disposed between the lower sidewall LS of the first penetrating hole 320h and the upper electrode 330.

The lower sidewall LS of the first penetrating hole 320h may be negatively tapered. Thus, in the organic light-emitting display device according to the embodiment of the present disclosure, an end portion of the organic emitting layer 320 which faces the penetrating hole CH may be separated from the lower electrode 310. For example, the end portion of the organic emitting layer 320 facing the penetrating hole CH may include an undercut UC. The upper sidewall US of the first penetrating hole 320h may be positively tapered. The vertical length t1 of the lower sidewall LS of the first penetrating hole 320h may be less than the vertical length t2 of the upper sidewall US of the first penetrating hole 320h.

The second penetrating hole 330h may be aligned with the first penetrating hole 320h. A minimum width W1 of the first penetrating hole 320h may be smaller than a minimum width W2 of the second penetrating hole 330h. For example, the sidewall of the second penetrating hole 330h may be disposed on the upper sidewall LS of the first penetrating hole 320h. The end portion of the organic emitting layer 320 facing the penetrating hole CH may be closer to the penetrating hole CH than an end portion of the upper electrode 330 which faces the penetrating hole CH. Thus, in the organic light-emitting display device according to the embodiment of the present disclosure, electrical connection between the lower electrode 310 and the upper electrode 330 around the particles P can be effectively prevented.

The optical compensation layer 400 may be disposed on the light-emitting structure 300. Optical characteristics of light emitted from the light-emitting structure 300 may be controlled by the optical compensation layer 400. For example, the optical compensation layer 400 may correct a color viewing angle and color coordinates of light which has passed through the upper electrode 330. Thus, in the organic light-emitting display device according to the embodiment of the present disclosure, the thickness of the upper electrode 330 may be reduced without changing the optical characteristics of emitted light.

The optical compensation layer 400 may be extended onto the bank insulating layer 350. The penetrating hole CH may be covered by the optical compensation layer 400. For example, the optical compensation layer 400 may cover the second penetrating hole 330h. The optical compensation layer 400 may be extended to the inside of the first penetrating hole 320h and the second penetrating hole 330h. For example, the optical compensation layer 400 may be in direct contact with the lower electrode 310 in the first penetrating hole 320h. The optical compensation layer 400 may be in direct contact with the lower sidewall LS of the first penetrating hole 320h. The optical compensation layer 400 may surround the particles P. For example, the penetrating hole CH may be completely filled with the particles P and the optical compensation layer 400.

The optical compensation layer 400 can prevent electrical connection between the lower electrode 310 and the upper electrode 330. For example, the electrical resistance of the optical compensation layer 400 may be much greater than that of the lower electrode 310 and the upper electrode 330. The optical compensation layer 400 may include a transparent material. In one embodiment, the optical compensation layer 400 is an electrical insulator. Therefore, it blocks current flow from electrode 310 to electrode 330 and prevents the shorting out of the two layers within the pixel. For example, the optical compensation layer 400 may include oxide.

The optical compensation layer 400 therefore acts as an isolation material and a repair material. It electrically isolates one or more particles P that may be present on the lower electrode 310 to prevent the electrode 310 from being in electrical contact with the upper electrode 330. It therefore limits the damaged area caused by particle P to its exact location and, while that particular point at which the particle P is located will not emit light, there is no electrical short from the lower electrode 310 to the upper electrode 330, and therefore the pixel as a whole will be able to emit light. The area of particle P is quite small compared to the area of an entire pixel and thus the pixel as a whole emits light as if it had no defect.

The organic light-emitting display device according to the embodiment of the present disclosure may further include an element passivation layer 500 on the optical compensation layer 400. The element passivation layer 500 can protect the light-emitting structure 300 from external moisture or impact. The element passivation layer 500 may include an insulating material. The element passivation layer 500 may include a transparent material. For example, the element passivation layer 500 can include silicon oxide and/or silicon nitride. The element passivation layer 500 may be a multi-layer structure.

In the organic light-emitting display device according to the embodiment of the present disclosure, light reflection at the interface between the upper electrode 330 and the optical compensation layer 400, and between the optical compensation layer 400 and the element passivation layer 500 can be minimized. For example, the optical compensation layer 400 may have a refractive index between the refractive index of the upper electrode 330 and the refractive index of the element passivation layer 500. Thus, in the organic light-emitting display device according to the embodiment of the present disclosure, deterioration in emission efficiency due to the optical compensation layer 400 may be prevented.

The optical compensation layer 400 can prevent infiltration of hydrogen from the element passivation layer 500 or the outside. For example, the optical compensation layer 400 may include an oxide of a hydrogen storage metal. The optical compensation layer 400 may include at least one of group-1, group-2, group-3, group-4, group-12, group-13 and group-14 metals and transition metals as the hydrogen storage metal. For example, the optical compensation layer 400 may include at least one of niobium oxide (NbO), molybdenum oxide (MoO), tantalum oxide (TaO), hafnium oxide (HfO), titanium oxide (TiO) and zinc oxide (ZnO). The optical compensation layer 400 may be a multi-layer structure.

Figure 5:
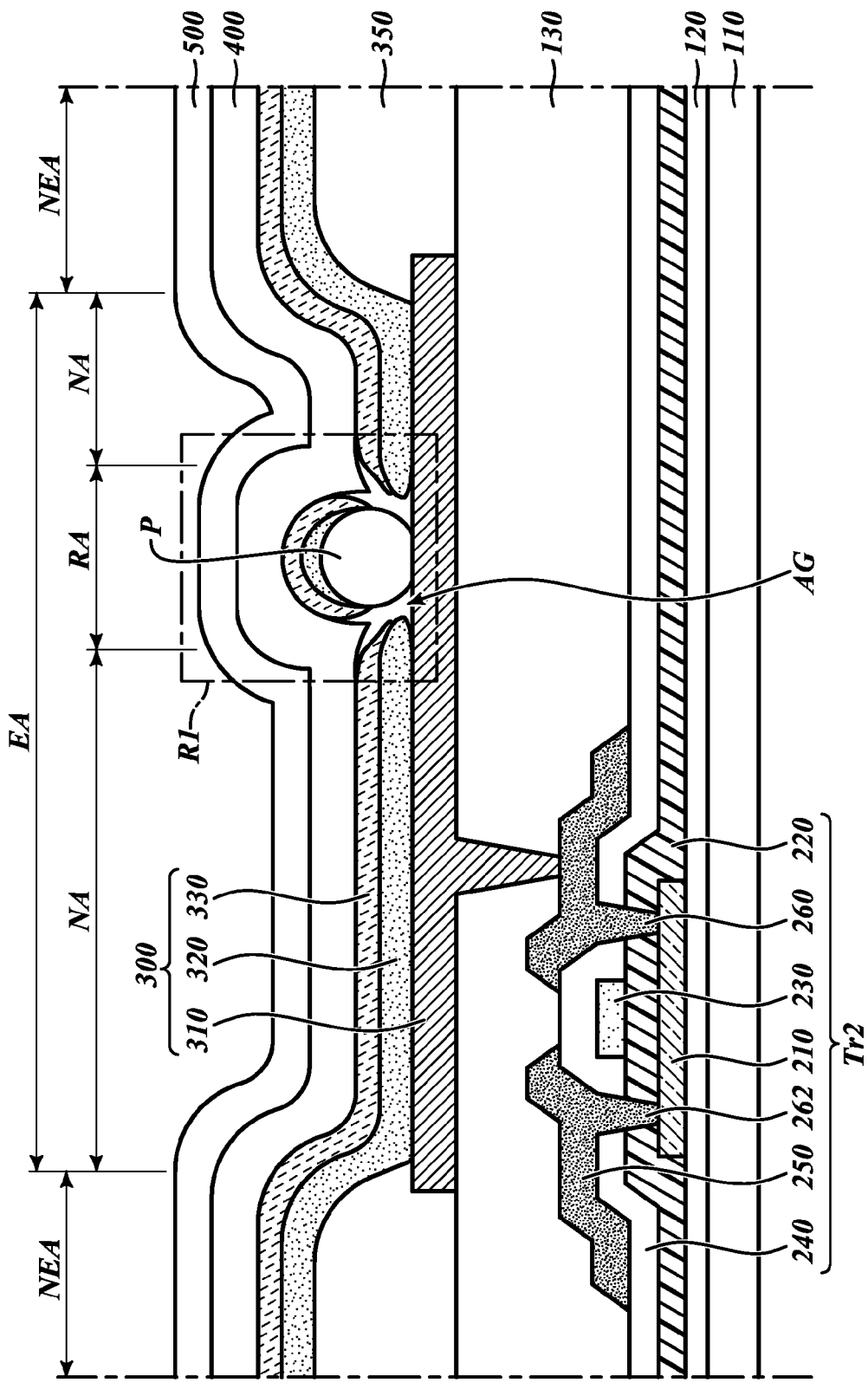
FIG. 5 is a cross-sectional view showing an organic light-emitting display device according to another embodiment of the present disclosure.
Figure 6:
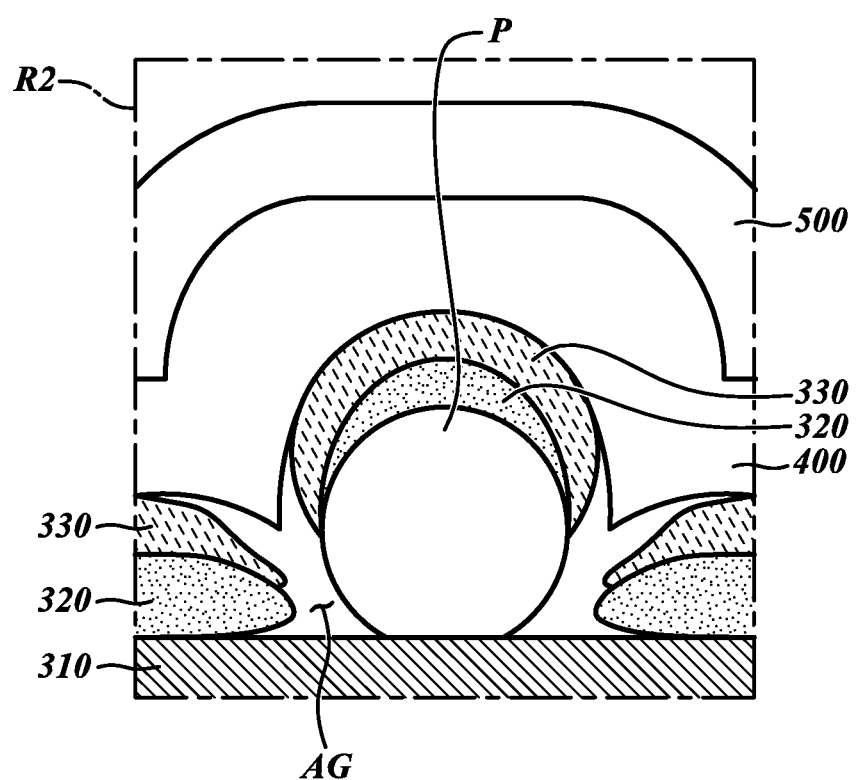
FIG. 6 is an enlarged view of an area R2 of FIG. 5.

The organic light-emitting display device according to the embodiment of the present disclosure is described that the optical compensation layer 400 directly contacts with the lower electrode 310 in the first penetrating hole 320h. However, an organic light-emitting display device according to another embodiment of the present disclosure may further include an air gap AG between the lower electrode 310 and the optical compensation layer 400 on the repair area RA of the lower substrate 110, as shown in FIGS. 5 and 6. The air gap AG may refer to a space filled with air. The air gap AG may be connected to the undercut of the organic emitting layer 320.

The use of an air gap AG to electrically isolate lower electrode 310 from upper electrode 330 is also effective and acceptable. A gap between the two electrodes, whether filled with air, a neutral gas, such as argon, nitrogen, a vacuum, or other non-conducting material is acceptable to electrically isolate the upper and lower electrodes from each other and prevent them from shorting to each other.

Figure 7A:
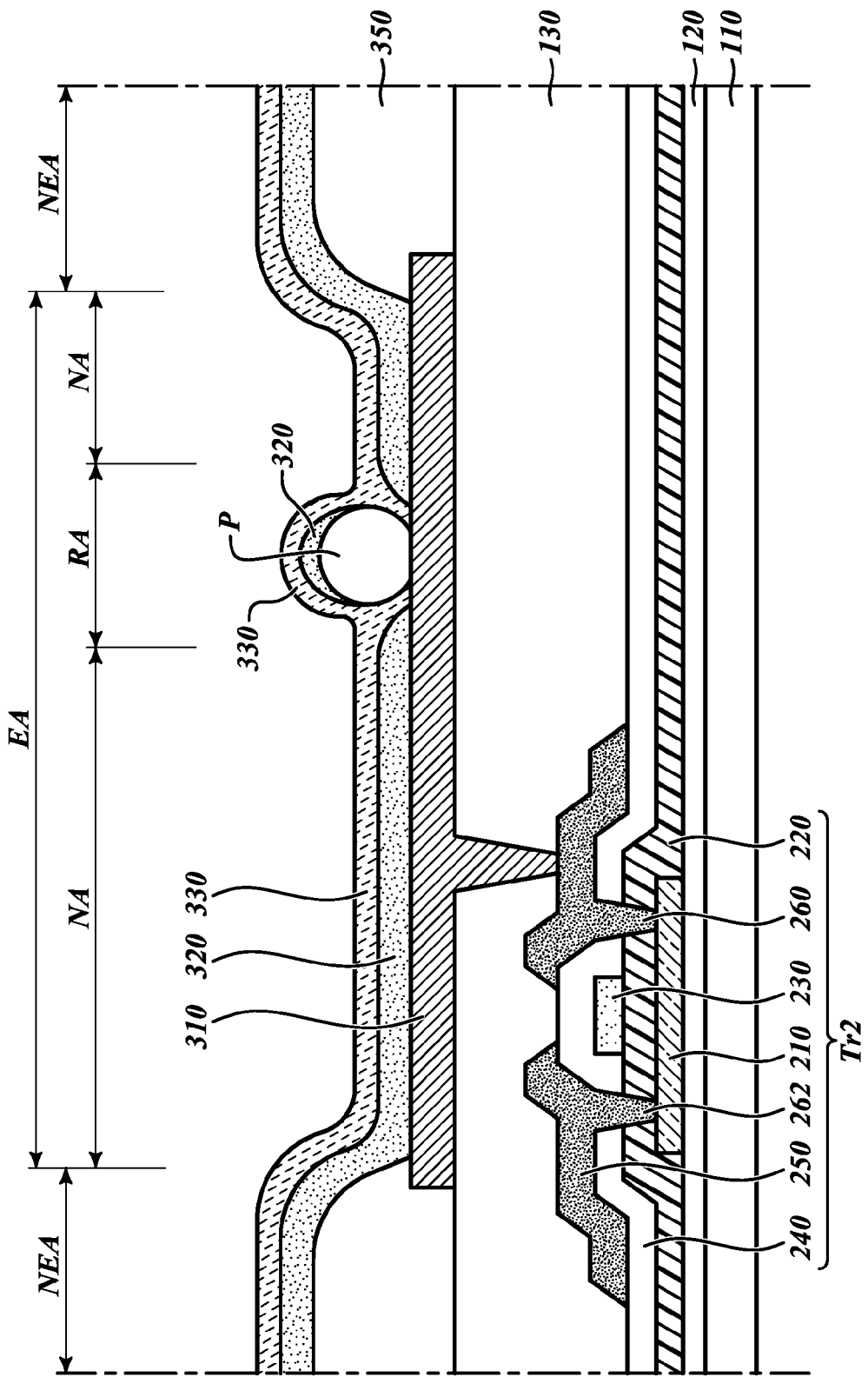
FIGS. 7A to 7C are cross-sectional views sequentially illustrating a method of manufacturing an organic light-emitting display device according to an embodiment of the present disclosure.
Figure 7B:
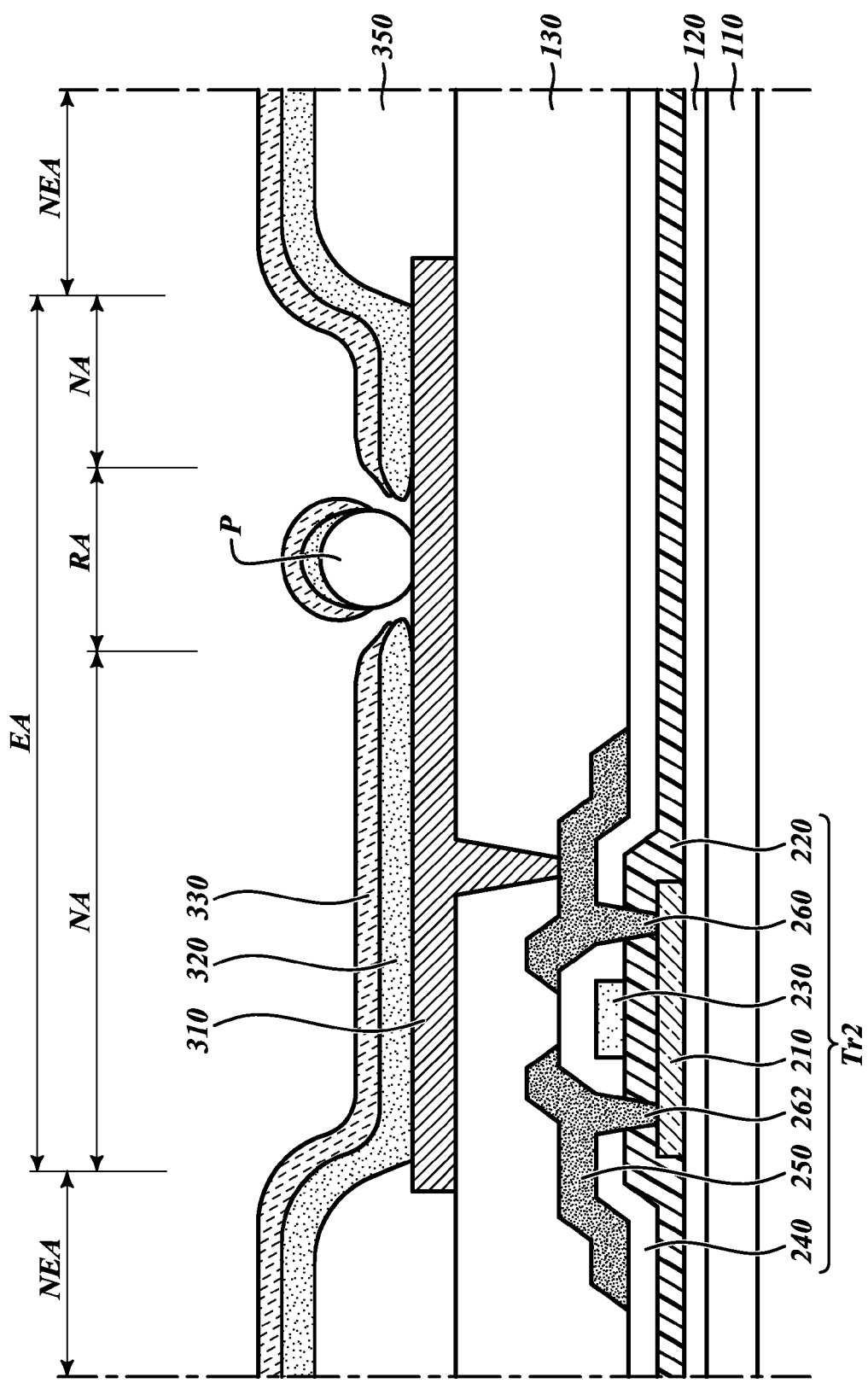
Figure 7C:
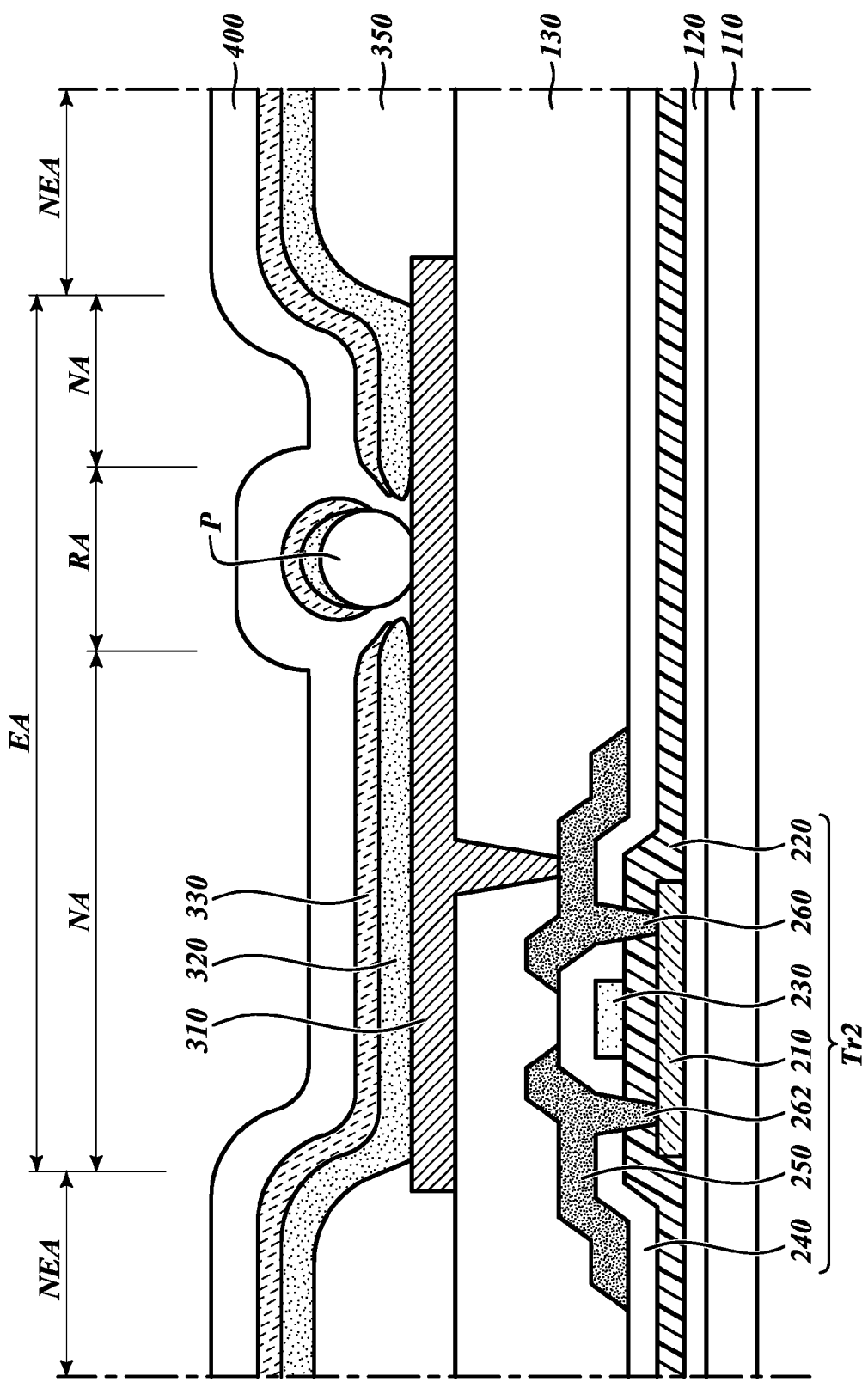

FIGS. 7A to 7C are cross-sectional views sequentially illustrating a method of manufacturing the organic light-emitting display device according to an embodiment of the present disclosure.

A method of manufacturing the organic light-emitting display device according to an embodiment of the present disclosure will be described with reference to FIGS. 1, 4 and 7A to 7C. Referring to FIG. 7A, method of manufacturing the organic light-emitting display device according to an embodiment of the present disclosure may include a process of forming the buffer layer 120 on the lower substrate 110, a process of forming the thin film transistor Tr2 on the buffer layer 120, a process of forming the over-coat layer 130 covering the thin film transistor Tr2 on the lower substrate 110, a process of forming the lower electrode 310 electrically connected to the thin film transistor Tr2 on the over-coat layer 130, a process of forming the bank insulating layer 350 covering the edge of the lower electrode 310, a process of forming the organic emitting layer 320 on the lower electrode 310 and the bank insulating layer 350, and a process of forming the upper electrode 330 on the organic emitting layer 320.

The process of forming the thin film transistor Tr2 may include a process of forming the semiconductor material 210, a process of forming the gate insulating layer 220 on the semiconductor material 210, a process of forming the gate electrode 230 on the gate insulating layer 220, a process of forming the interlayer insulating layer 240 on the gate electrode 230 and a process of forming the source electrode 250 and the drain electrode 260 on the interlayer insulating layer 240.

The process of forming the lower electrode 310 may include a process of forming a conductive material layer on the over-coat layer 130 and a process of patterning the conductive material layer. The process of forming the bank insulating layer 350 may include a process of forming an insulating material layer covering the lower electrode 310 and a process of exposing the surface of the lower electrode 310 by etching the insulating material layer. The various processes for forming the layers as shown in FIG. 7A are well known in the art and therefore are not disclosed in detail. Any one of the many acceptable techniques for forming these layers and creating thin film transistors TR1 and TR2 together with the support material 130 on which the light-emitting layer 300 will be formed, is acceptable.

Particles P may be attached to the surface of the lower electrode 310 exposed by the bank insulating layer 350. The particles P may be generated in the process of patterning the conductive material layer for forming the lower electrode 310 and/or the process of etching the insulating material layer for forming the bank insulating layer 350.

As previously discussed, the particle P is a defect which, in a preferred structure, is not present. Unfortunately, while forming the lower electrode 310 or, in the process of transitioning from the formation of layer 310 until the layer 320 is formed, one or more small particles P may inadvertently attach to the upper surface of lower electrode 310. When these defective particles P attach to an upper surface of electrode 310, they are extremely small. They are of such small size it may not be possible to see them through normal techniques. In addition, it is not easily possible to remove them.

Unfortunately, if particles P are present, then the entire pixel becomes defective and does not emit light in the event that the two electrodes 310 and 330 are shorter together within the pixel.

The process of forming the organic emitting layer 320 may include a deposition process using evaporation. The organic emitting layer 320 may not cover the surface of the lower electrode 310 around the particles P. A portion of the surface of the lower substrate 110 vertically overlapping the particles P may be defined as the repair area RA. The organic emitting layer 320 may expose a portion of the lower electrode 310 disposed on the repair area RA of the lower substrate 110 due to the particles P.

The process of forming the upper electrode 330 may include a sputtering process which has relative higher step coverage. The organic emitting layer 320 and the particles P may be surrounded by the upper electrode 330. The upper electrode 330 may cover the surface of the lower electrode 310 which is exposed by the organic emitting layer 320. The upper electrode 330 may be in direct contact with the lower electrode 310, thus creating the need for a repair. In particular, as can be seen by viewing FIG. 7A, the upper electrode 330 is in direct contact with the lower electrode 310. In this position, the two electrodes are shorted together and the pixel will not emit light for its entire area. If a repair is not carried out, then the entire pixel will remain defective, thus lowering the quality of the display screen as a whole because any pixel with a particle will not emit light.

If the pixel is not repaired, then it may be necessary to discard the display and it cannot be used or sold. This is a significant economic loss because the time and materials to manufacture a display have been carried out; however, at the end of the process, because of defects, it must be discarded and cannot be sold. It is therefore desired to repair those pixels which are defective in order to maintain the display in operating condition so that it can be used.

The method of repair will now be explained according to principles as described herein.

Referring to FIG. 7B, the method of manufacturing the organic light-emitting display device according to the embodiment of the present disclosure may include a repair process which is a process of removing a portion of the upper electrode 330 connected to the lower electrode 310 due to the particles P.

The repair process may include an R-aging process using Joule heating. For example, the repair process may include a process of applying a high voltage in the form of a pulse to the lower electrode 310 and the upper electrode 330. In particular, when the display is in the condition as shown in FIG. 7B, Joule heating is carried out in order to physically separate the upper electrode 330 from the lower electrode 310.

In one embodiment an electric current is passed from electrode 310 through electrode 330. Namely, a positive voltage is put on electrode 310 while electrode 330 is grounded (or vice versa). At those locations where electrodes 310 and 330 do not contact each other, there will be no current flow. However, in those locations where there is a direct contact between the electrodes, such as shown in FIG. 7A, there will be a large current flow from electrode 310 through electrode 330.

As previously described, electrode 330 is relatively thin, as compared to electrode 310 and also is made of a transparent material which is not as robust as the electrode 310. Since the electrode 330 is substantially thinner, for example, twice as thin or three times as thin as the electrode 310, and further, because it is made of a much more resistive material, then electrode 330 will significantly heat up at the contact location due to its own internal resistance since it is carrying a relatively large current. Since electrode 310 is approximately two to three times thicker than electrode 330, it has a lower resistance and further it is a type of metal which has lower resistivity, such as aluminum or copper. Electrode 330, on the other hand, is a type of conductor with a higher resistivity than pure metal, as is the case for indium tin oxide, or other transparent electrode material. Therefore, for both reasons, the resistive heating in electrode 330 will be significantly higher than that of electrode 310. The current concentration will occur at exactly the junction between electrodes 310 and 330 because of the small surface area; mainly, there will be a relatively high current at the point where the two metals touch each other. This will cause electrode 330 to melt, vaporize, evaporate, or otherwise be removed at this location. This removal is shown by comparing FIG. 7A with FIG. 7B. But, electrode 310 will not significantly heat up and change will take place in it.

As can be seen in FIG. 7A, when layer 320 is deposited, some of it overlays on top of the particle P and does not overlay directly on the electrode 310, which creates an open spot on electrode 310 immediately adjacent either side of the particle. Then when the electrode 330 is deposited, some of it overlays on top of the particle P, and some will be directly adjacent particle P, where it is in direct contact with the electrode 310. The area of contact will generally be a very small area and therefore for a current passing through there will be a relatively high current concentration per surface area, which will cause a high amount of heating in a very specific location of electrode 330.

After the current has passed through the junction of electrode 310 and 330, the result is shown in FIG. 7B, in which the heating has caused some melting, vaporization, or otherwise removal of the electrode 330 as well as some lifting up of the organic light-emitting layer 320 away from electrode 310 due to the heating effect. Therefore, this has created a hole. Namely, a first penetrating hole 320h is made through the organic light-emitting layer 320 and a second penetrating hole 330h is made through the upper electrode 330. As previously noted, there is already a hole 320h present in the organic light-emitting layer, before the heating.

The presence of this hole is the reason why the short-circuit may occur and is the cause of the potential defect. The heating of the substrate will slightly increase this hole, but it will also change the shape and configuration of the hole 320h. For example, as can be seen by comparing FIG. 7A to FIG. 7B, the hole 320h will become slightly different in shape and the organic light-emitting layer will have its profile changed at the edges and may, in some instances, be slightly lifted off of the lower electrode 310 due to the heating effect.

The voltage level and amount of current provided during the Joule heating step will be based upon the type of material used for the electrodes 310 and 330 as well as their relative thicknesses to each other and the resistivity of each. Preferably, a voltage and current are selected to have negligible heating effect in 310 and also to have little heating effect in the broad area of upper electrode 330. Namely, the voltage and current are selected to be sufficiently low that the general bulk of electrodes 330 and 310 are not significantly heated nor damaged. However, at the area of contact between the two, a large amount of current will be required to pass through a very small area. Therefore, at this particular point of current flow, sufficient heating will take place to remove the material 330 that is in direct contact with the lower electrode 310. Each product will have a slightly different voltage and current concentration to achieve this result, and given the goals as discussed herein, a person of ordinary skill in the art would be able, in a short period of time, to determine the preferred current and voltage that will heat those small areas of contact between the two sufficient to cause the electrode 330 to be removed at this location without causing excessive heating in either of the bulk material of electrodes 310 or 330.

In the method of manufacturing the organic light-emitting display device according to the embodiment of the present disclosure, the upper electrode 330 may be formed relatively thin, in order to reduce a time required for the repair process. For example, the upper electrode 330 may be thinner than the lower electrode 310, in some cases, two to three times thinner.

In the organic light-emitting display device according to the embodiment of the present disclosure, since the upper electrode 330 is thin, the portion of the upper electrode 330 which is connected to the lower electrode due to the particles P may be completely removed by the repair process performed for a short time. The repair process may affect the end portion of the organic emitting layer 320 facing the particles P because the upper electrode 330 is rapidly removed. For example, the bottom of the end portion of the organic emitting layer 320 which faces the particles P may be partly removed by the repair process. For example, an undercut may be formed at the end portion of the organic emitting layer 320 facing the particles P due to the repair process.

Referring to FIG. 7C, the method of manufacturing the organic light-emitting display device according to the embodiment of the present disclosure may include a process of forming the optical compensation layer 400 on the upper electrode 330.

The optical compensation layer 400 may be extended onto the repair area RA of the lower substrate 110. The optical compensation layer 400 may be extended onto the space between the particles P and the organic emitting layer 320, and between the particles P and the upper electrode 330. For example, the particles P may be surrounded by the optical compensation layer 400. The space between the particles P and the organic emitting layer 320, and between the particles P and the upper electrode 330 may be filled with the optical compensation layer 400. For example, the optical compensation layer 400 may be extended to the undercut of the organic emitting layer 320.

As shown in FIG. 2, the method of manufacturing the organic light-emitting display device according to the embodiment of the present disclosure may include a process of forming the element passivation layer 500 on the optical compensation layer 400.

In the organic light-emitting display device manufactured by the manufacturing method according to the embodiment of the present disclosure, the undercut UC may be formed at the end portion of the organic emitting layer 320 facing the particles P due to the repair process, as shown in FIGS. 3 and 4. Thus, in the organic light-emitting display device manufactured by the manufacturing method according to the embodiment of the present disclosure, the end portion of the organic emitting layer 320 facing the penetrating hole CH penetrating the organic emitting layer 320 and the upper electrode 330 may be positioned closer to the particles P than the end portion of the upper electrode 330 facing the penetrating hole CH on the repair area RA of the lower substrate 110. Therefore, in the organic light-emitting display device manufactured by the manufacturing method according to the embodiment of the present disclosure, the upper electrode 330 which is connected to the lower electrode 310 due to the particles can be securely insulated from the lower electrode 310 by the repair process.

Accordingly, in the organic light-emitting display device manufactured by the manufacturing method according to the embodiment of the present disclosure, a time taken to perform the repair process can be reduced because the optical compensation layer 400 for correcting optical characteristics is formed on the upper electrode 330 in order to enable formation of a thin upper electrode 330. Therefore, in the organic light-emitting display device manufactured by the manufacturing method according to the embodiment of the present disclosure, the end portion of the organic emitting layer 320 can be deformed by the remove process of the thin upper electrode 330, at the location of the defect, so that electrical connection between the lower electrode 310 and the upper electrode 330 due to the particles P may be securely prevented. Thus, the production efficiency and reliability of the organic light-emitting display device according to the embodiment of the present disclosure can be improved.

The method of creating the hole 330h in the organic light-emitting display device according to the embodiment of the present disclosure is done first and then, because the optical compensation layer is formed after the repair process, the optical compensation layer will fill the space, which is formed by removing the organic emitting layer and the upper electrode due to the heating process in one embodiment. According to this first embodiment, during the heating step, the layer 400 has not yet been deposited and the upper electrode 330 is exposed to the surrounding ambient atmosphere. In one embodiment, this will be a standard air pressure and temperature. In other embodiments the substrate may be placed in a chamber in which a vacuum is drawn and the chamber may be slightly heated. The placing of the substrate as shown in FIG. 7A in a vacuum chamber that can reduce the pressure below standard air pressure and applying a somewhat elevated temperature will enhance the removal of the electrode 330 at the location where the two substrates contact each other, thus, increasing the rate of removal and encouraging the vaporization of the electrode 330. Of course, care is taken to ensure that the bulk material of the upper electrode 330 is not evaporated or moved during the process.

Therefore, in most embodiments, carrying out the process at standard temperature and pressure is acceptable. However, if rapid removal, or more reliable removal of all defects due to particles is desired, then placing the substrate in a chamber in which some air is removed so that it is held at a lower air pressure, such as 50% or 10% of standard air pressure, would further increase the rate of removal of the material of second electrode 330 at the point of direct contact.

Figure 8A:
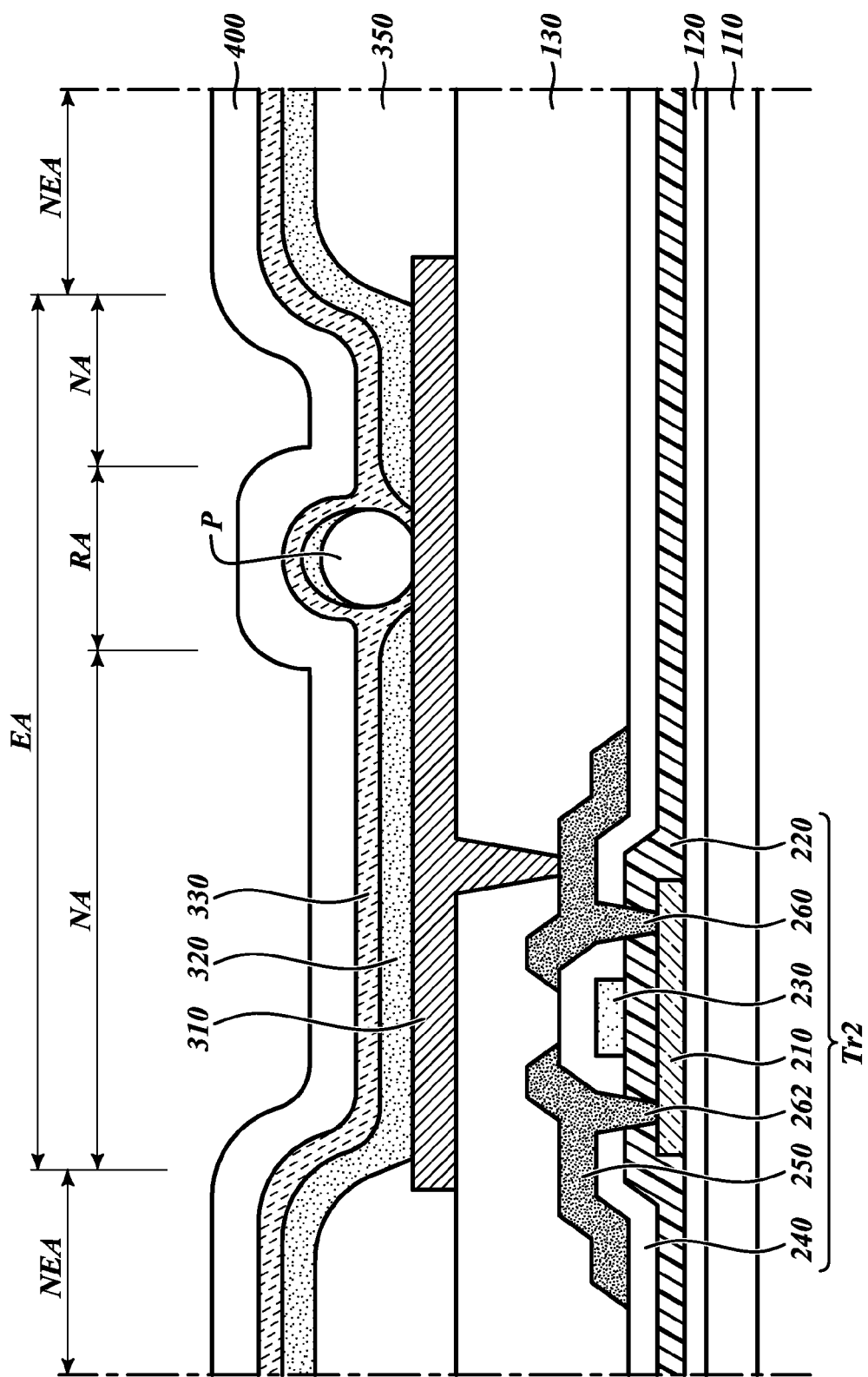
FIGS. 8A and 8B are cross-sectional views sequentially illustrating a method of manufacturing an organic light-emitting display device according to an embodiment of the present disclosure.

A second embodiment may also be carried out, which is to apply the layer 400 first, before the repair is carried out by the Joule heating, shown in FIG. 8A. Namely, as can be seen in FIG. 8A, the layer 400 has been applied and the repair has not yet been carried out because the upper electrode 330 is shown in direct contact with the lower electrode 310 and thus, at that point of contact, there is a shorting of the electrodes, which would be a defect. In this alternative embodiment, the repair is carried out by performing the heating after a layer 400, and potentially after layer 500 or other layers have been applied. In this situation, shown in FIG. 8B, the heating creates an air gap AG which physically and electrically isolates the upper electrode 330 from the lower electrode 310 which also is effective to prevent shorting of the two electrodes together during standard operation of the device, thus repairing that particular pixel. According to a method of manufacturing an organic light-emitting display device according to another embodiment of the present disclosure, the repair process after the optical compensation layer is formed on the upper electrode, so that the air gap AG may be formed between the lower electrode 310 and the optical compensation layer 400 around the particles P, as shown in FIGS. 8A and 8B.

Figure 8B:
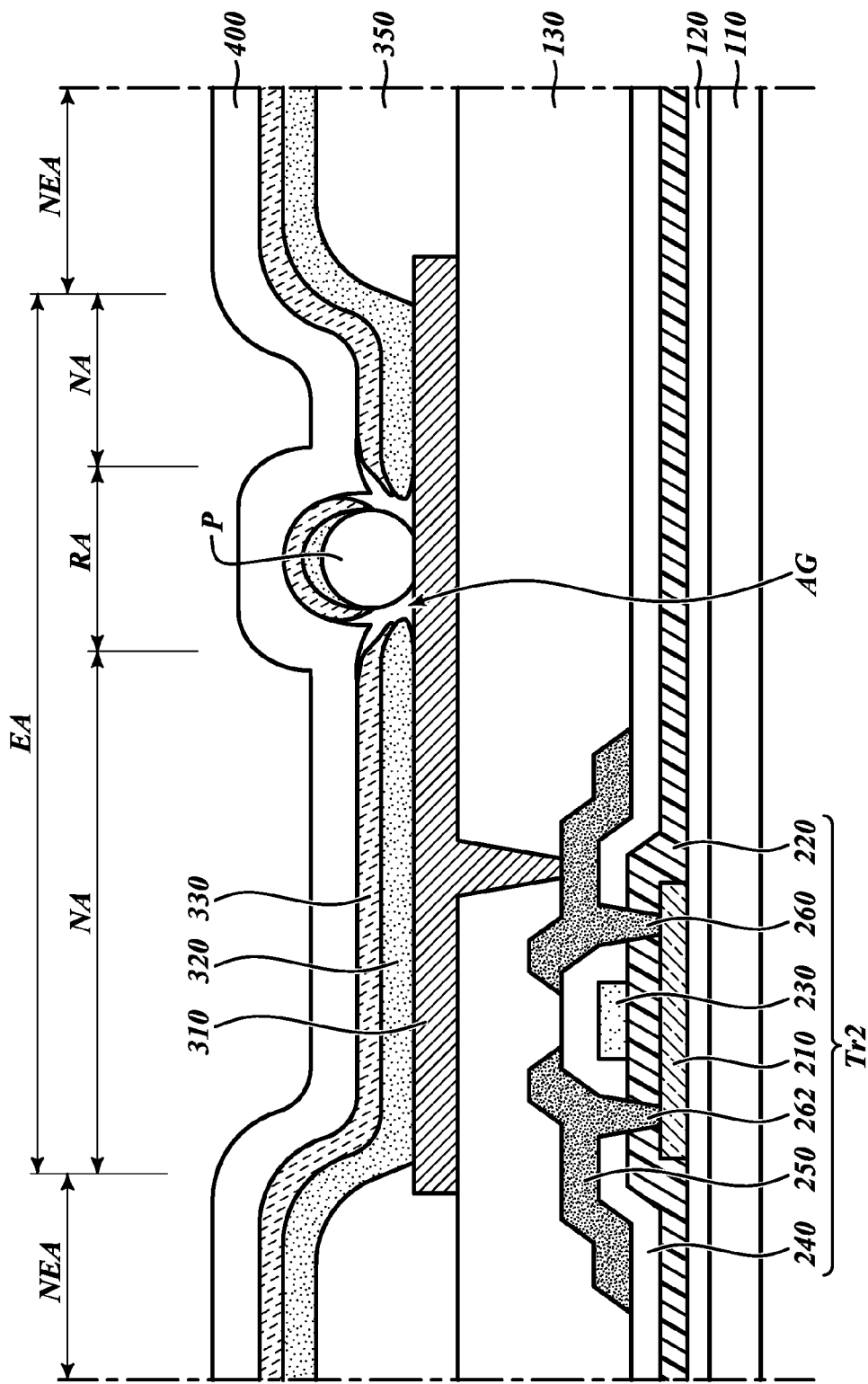

The benefit of the sequence of the steps of FIGS. 8A and 8B is that the repair can be carried out on the final product, either before packaging or just after packaging. In the final product, the terminals for applying direct power to the electrodes 310 and 330 are provided as part of the final part, so affecting the repair is easy and low cost in the overall manufacturing process. In the embodiment of FIGS. 7A-7C, the repair is carried out in the middle of the manufacturing process, thus requiring the part to be removed from the semiconductor production line process and an electrical current applied, after which the part is reintroduced to the manufacturing process.

As has been described, a technique to reliably and rapidly repair defective pixels can be carried out according to the principles as discussed herein. Some display substrates or some pixels may have no defects, because no particles are present. Carrying out the step of providing a relatively high voltage to electrode 310, while grounding 330, will cause no current to flow in such pixels. However, no harm will be done to the device because the two electrodes were electrically isolated and no current will flow in those pixels. On the other hand, if there are one or more particles inadvertently on top of lower electrode 310, which has caused the upper electrode 330 to short to it, all of those locations will be repaired simultaneously, and quickly. There might be, in a large display device, many thousands of pixels, and several thousands of subpixels. All of these pixels and subpixels can be repaired simultaneously with each other by removing material that directly surrounds each particle and thus repairing the display so that rather than being discarded, it can continue to be used and each subpixel will then be usable to output light.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device comprising:
   a lower electrode on a lower substrate;
   an organic emitting layer on the lower electrode, the organic emitting layer including a first penetrating hole;
   an upper electrode on the organic emitting layer, the upper electrode including a second penetrating hole aligned with the first penetrating hole; and
   an optical compensation layer on the upper electrode, the optical compensation layer covering the second penetrating hole,
   wherein the sidewall of the first penetrating hole includes a lower sidewall which is negatively tapered, and a upper sidewall on the lower sidewall which is positively tapered.

2. The organic light-emitting display device of claim 1, wherein a ratio of a thickness of the upper electrode to a thickness of the lower electrode is in the range of ⅓ to 1/12.

3. The organic light-emitting display device of claim 1, wherein a minimum width of the second penetrating hole is less than a minimum width of the first penetrating hole.

4. The organic light-emitting display device of claim 1, wherein the optical compensation layer is extended to the inside of the first penetrating hole and the second penetrating hole.

5. The organic light-emitting display device of claim 4, wherein the optical compensation layer directly contacts the lower electrode in the first penetrating hole.

6. The organic light-emitting display device of claim 1, further comprising an element passivation layer on the optical compensation layer,
   wherein the refractive index of the optical compensation layer is a value between the refractive index of the upper electrode and the refractive index of the element passivation layer.

7. The organic light-emitting display device of claim 1, wherein the electrical resistance of the optical compensation layer is greater than that of the upper electrode.

8. An organic light-emitting display device comprising:
   a lower substrate including a normal area and a repair area;
   a light-emitting structure on the lower substrate, the light-emitting structure including a lower electrode, an organic emitting layer and an upper electrode, which area sequentially stacked, the upper electrode being thinner than the lower electrode;
   an optical compensation layer on the upper electrode of the light-emitting structure; and
   a penetrating hole on the repair area of the lower substrate, the penetrating hole penetrating the organic emitting layer and the upper electrode of the light-emitting structure,
   wherein an end portion of the organic emitting layer facing the penetrating hole includes an undercut.

9. The organic light-emitting display device of claim 8, wherein the end portion of the organic emitting layer facing the penetrating hole is disposed closer to the penetrating hole than an end portion of the upper electrode facing the penetrating hole.

10. The organic light-emitting display device of claim 8, further comprising an air gap between the lower electrode and the optical compensation layer on the repair area of the lower substrate.

11. An organic light-emitting display device comprising:
    a light-emitting structure including a lower electrode, an organic emitting layer and an upper electrode, which are sequentially stacked, the upper electrode being thinner than the lower electrode;
    an optical compensation layer on the upper electrode of the light-emitting structure; and
    a penetrating hole penetrating the organic emitting layer and the upper electrode of the light-emitting structure.

12. The organic light-emitting display device of claim 11, wherein an end portion of the upper electrode facing the penetrating hole is insulated from the lower electrode by a portion of the optical compensation layer or by an air gap, or a combination of both.

13. The organic light-emitting display device of claim 11, wherein an end portion of the upper electrode facing the penetrating hole is insulated from the lower electrode by a portion of the optical compensation layer and an air gap.

14. The organic light-emitting display device of claim 11, wherein an end portion of the organic emitting layer facing the penetrating hole includes an undercut.

15. The organic light-emitting display device of claim 11, the end portion of the organic emitting layer facing the penetrating hole is disposed closer to the penetrating hole than an end portion of the upper electrode facing the penetrating hole.

16. The organic light-emitting display device of claim 11 further comprising:
    an element passivation layer on the optical compensation layer,
    wherein the refractive index of the optical compensation layer is a value between the refractive index of the upper electrode and the refractive index of the element passivation layer.

17. The organic light-emitting display device of claim 11, wherein the optical compensation layer includes metal oxide that acts as a hydrogen storage element.

18. A method for manufacturing a light-emitting display device comprising:
    depositing a light-emitting structure including a lower electrode layer, a light-emitting layer and an upper electrode layer, which are sequentially stacked;
    depositing an optical compensation layer on the upper electrode layer of the light-emitting structure; and
    passing an electrical current through the light-emitting structure sufficient to produce a hole at a repair area penetrating both the light-emitting layer and the upper electrode of the light-emitting structure.

19. The method of claim 18 wherein the step of passing an electrical current through the light-emitting structure sufficient to produce a hole at a repair area is carried out before depositing the optical compensation layer.

20. The method of claim 18 wherein the step of passing an electrical current through the light-emitting structure sufficient to produce a hole at a repair area is carried out after depositing the optical compensation layer.

\* \* \* \* \*

UNITED STATES PATENT AND TRADEMARK OFFICE
CERTIFICATE OF CORRECTION

PATENT NO. : 10,134,820 B2
APPLICATION NO. : 15/799843
DATED : November 20, 2018
INVENTOR(S) : Young-Mi Kim et al.

Page 1 of 1

It is certified that error appears in the above-identified patent and that said Letters Patent is hereby corrected as shown below:

In the Claims

Column 17, Lines 65-66:
"which area sequentially stacked" should read --which are sequentially stacked--.

Signed and Sealed this
Fifth Day of November, 2019

Andrei Iancu
*Director of the United States Patent and Trademark Office*